(12) United States Patent
Wang et al.

(10) Patent No.: US 12,414,266 B2
(45) Date of Patent: Sep. 9, 2025

(54) COOLING APPARATUS AND ELECTRONIC DEVICE

(71) Applicant: HUAWEI TECHNOLOGIES CO., LTD., Guangdong (CN)

(72) Inventors: Chao Wang, Dongguan (CN); Hitoshi Sakamoto, Yokohama (JP)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 258 days.

(21) Appl. No.: 18/308,733

(22) Filed: Apr. 28, 2023

(65) Prior Publication Data

US 2023/0269906 A1   Aug. 24, 2023

Related U.S. Application Data

(63) Continuation of application No. PCT/CN2021/123054, filed on Oct. 11, 2021.

(30) Foreign Application Priority Data

Oct. 31, 2020  (CN) .......................... 202011197002.6

(51) Int. Cl.
  *H05K 7/20*   (2006.01)
  *H05K 1/02*   (2006.01)
(52) U.S. Cl.
  CPC ....... *H05K 7/20272* (2013.01); *H05K 1/0203* (2013.01); *H05K 2201/064* (2013.01)
(58) Field of Classification Search
  None
  See application file for complete search history.

(56) References Cited

U.S. PATENT DOCUMENTS 5,168,348 A   12/1992   Chu et al.
5,959,351 A    9/1999   Sasaki et al.
(Continued)

FOREIGN PATENT DOCUMENTS

CN   1652328 A    8/2005
EP   0878852 A1  11/1998
(Continued)

OTHER PUBLICATIONS

Wei Tiwei et al: "Experimental Characterization of a Chip-Level 3-D Printed Microjet Liquid Impingement Cooler for High-Performance Systems", IEEE Transactions on Components, Packaging and Manufacturing Technology, IEEE, USA, vol. 9, No. 9, Sep. 1, 2019 (Sep. 1, 2019), pp. 1815-1824, XP011750615.
(Continued)

*Primary Examiner* — Courtney L Smith

(57) ABSTRACT

A cooling apparatus is provided, including a jet plate and a carrier plate provided with an accommodating groove, a coolant inlet, and a coolant outlet. The jet plate is in the accommodating groove, with nozzles provided on the jet plate in a protruding manner. A distribution cavity is between the jet plate and the carrier plate, and the distribution cavity communicates with the coolant inlet, which is for injection of cooling liquid. A collection cavity for backflow of the cooling liquid is formed in the accommodating groove, and is separated from the distribution cavity. The coolant outlet communicates with the collection cavity. The cooling liquid is distributed to the jet plate through the distribution cavity, and is sprayed to the collection cavity through the nozzles for heat exchange, and the cooling liquid obtained through heat exchange is converged in the collection cavity and flows out through the coolant outlet.

20 Claims, 17 Drawing Sheets

(56) References Cited

U.S. PATENT DOCUMENTS

| | | | |
|---|---|---|---|
| 6,105,373 A * | 8/2000 | Watanabe | F25B 21/02 |
| | | | 62/3.7 |
| 6,650,542 B1 | 11/2003 | Chrysler et al. | |
| 7,277,283 B2 | 10/2007 | Campbell et al. | |
| 7,362,574 B2 | 4/2008 | Campbell et al. | |
| 7,375,962 B2 | 5/2008 | Campbell et al. | |
| 7,762,314 B2 | 7/2010 | Campbell et al. | |
| 7,802,442 B2 | 9/2010 | Bezama et al. | |
| 7,928,565 B2 | 4/2011 | Brunschwiler et al. | |
| 7,948,757 B2 | 5/2011 | Campbell et al. | |
| 7,992,627 B2 | 8/2011 | Bezama et al. | |
| 8,081,461 B2 | 12/2011 | Campbell et al. | |
| 8,391,008 B2 | 3/2013 | Dede | |
| 8,413,712 B2 | 4/2013 | Brunschwiler et al. | |
| 9,131,631 B2 | 9/2015 | Joshi | |
| 9,165,851 B2 * | 10/2015 | Ozaki | H10D 30/015 |
| 9,165,857 B2 | 10/2015 | Song et al. | |
| 9,247,672 B2 | 1/2016 | Mehring | |
| 9,477,275 B2 | 10/2016 | Choudhury et al. | |
| 9,484,283 B2 | 11/2016 | Joshi et al. | |
| 9,622,380 B1 | 4/2017 | Joshi et al. | |
| 9,903,664 B2 | 2/2018 | Joshi | |
| 9,943,931 B2 | 4/2018 | Li et al. | |
| 10,334,755 B2 | 6/2019 | Oprins et al. | |
| 10,651,112 B2 | 5/2020 | Malouin, Jr. et al. | |
| 10,665,529 B2 | 5/2020 | Smith et al. | |
| 10,903,141 B2 * | 1/2021 | Malouin, Jr. | H05K 7/20254 |
| 2003/0024689 A1 | 2/2003 | Nakahama et al. | |
| 2006/0250774 A1 * | 11/2006 | Campbell | H01L 23/4735 |
| | | | 361/699 |
| 2008/0278913 A1 | 11/2008 | Campbell et al. | |
| 2009/0314467 A1 * | 12/2009 | Campbell | H01L 23/4735 |
| | | | 165/80.4 |
| 2010/0039773 A1 | 2/2010 | Tilton et al. | |
| 2011/0157827 A1 | 6/2011 | Chao et al. | |
| 2012/0063091 A1 | 3/2012 | Dede et al. | |
| 2014/0190668 A1 | 7/2014 | Joshi et al. | |
| 2015/0043164 A1 * | 2/2015 | Joshi | G06F 1/20 |
| | | | 165/185 |
| 2015/0208555 A1 | 7/2015 | Flotta et al. | |
| 2017/0098593 A1 | 4/2017 | Eid et al. | |
| 2017/0196120 A1 | 7/2017 | Oprins et al. | |
| 2018/0145010 A1 | 5/2018 | Fukuoka et al. | |
| 2019/0364691 A1 | 11/2019 | Subrahmanyam et al. | |
| 2020/0126892 A1 | 4/2020 | Mahjoob et al. | |
| 2020/0328139 A1 * | 10/2020 | Chiu | H01L 25/0657 |

FOREIGN PATENT DOCUMENTS

| | | |
|---|---|---|
| EP | 2151863 A1 | 2/2010 |
| JP | 2018503057 A | 2/2018 |
| JP | 2020507212 A | 3/2020 |
| WO | 2018004861 A1 | 1/2018 |
| WO | 2019005107 A1 | 1/2019 |
| WO | 2019229415 A1 | 12/2019 |

OTHER PUBLICATIONS

Extended European Search Report dated Mar. 1, 2024, issued for European Application No. 21884913.1 (9 pages).
International Search Report dated Jan. 17, 2022 issued for International Application No. PCT/CN2021/123054 (9 pages).

* cited by examiner

COOLING APPARATUS AND ELECTRONIC DEVICE

CROSS-REFERENCE TO RELATED APPLICATIONS

This application is a continuation of International Application No. PCT/CN2021/123054, filed on Oct. 11, 2021, which claims priority to Chinese Patent Application No. 202011197002.6, filed on Oct. 31, 2020. The disclosures of the aforementioned applications are hereby incorporated by reference in their entireties.

TECHNICAL FIELD

This disclosure relates to the field of electronic device technologies, and in particular, to a cooling apparatus and an electronic device.

BACKGROUND

With improvement of hardware integration in an electronic device, a quantity of chips and components integrated on a circuit board continuously increases. In a running process of the electronic device, the chips and the components may generate a large amount of heat. In addition, power of a high-performance chip on the circuit board continuously increases, and integration of a single cabinet in an equipment room in which the electronic device is placed also continuously improves, causing power density of the single cabinet in the equipment room to continuously increase, and posing higher requirements for cooling of the electronic device in the equipment room. To avoid impact of heat on the chips and the components, an air-cooled heat sink is usually used to synchronously take away the heat on the chips and auxiliary components. Currently, the air-cooled heat sink fails to meet an increasing heat dissipation requirement.

SUMMARY

In view of this, it is necessary to provide a cooling apparatus and an electronic device with a good cooling effect.

A first aspect of embodiments of this disclosure provides a cooling apparatus, including a jet plate and a carrier plate. The carrier plate is provided with an accommodating groove, a coolant inlet, and a coolant outlet. The jet plate is provided in the accommodating groove, and a plurality of nozzles are provided on the jet plate in a protruding manner. A distribution cavity is provided between the jet plate and the carrier plate, and the distribution cavity communicates with the coolant inlet. The coolant inlet is configured to inject cooling liquid. A collection cavity for backflow of the cooling liquid is formed in the accommodating groove, and the collection cavity is separated from the distribution cavity. The coolant outlet communicates with the collection cavity and is used for the cooling liquid to flow out of the collection cavity. The cooling liquid is distributed to the jet plate through the distribution cavity, and is sprayed to the collection cavity through at least one of the nozzles for heat exchange, and the cooling liquid obtained through the heat exchange is converged in the collection cavity and flows out through the coolant outlet.

The cooling apparatus implements, by disposing the distribution cavity between the jet plate and the carrier plate, and disposing the nozzle on the jet plate, a spray of the cooling liquid in the distribution cavity by using the nozzle, and performs heat dissipation on the heater unit through an effect of forced convection heat transfer of the jet. In this way, an effect of the heat exchange is good.

In a possible implementation of the first aspect, the nozzle extends from a side of the jet plate facing away from the carrier plate, the jet plate is provided with a nozzle hole, and the nozzle hole penetrates through the jet plate and the nozzle. Through an extended nozzle and the nozzle hole that is provided in the extended nozzle, the cooling liquid in the distribution cavity is able to form the jet under an action of driving force, and then be sprayed onto a surface of the heater unit.

In a possible implementation of the first aspect, the carrier plate includes a top wall and a peripheral wall, the peripheral wall surrounds the top wall to form the accommodating groove, and the coolant inlet and the coolant outlet are both provided on the top wall.

In a possible implementation of the first aspect, the distribution cavity is disposed on the jet plate.

In a possible implementation of the first aspect, the distribution cavity includes the jet plate and a side wall that surrounds the jet plate, one end of the side wall is in contact with the jet plate, the other end of the side wall is in contact with the top wall, and the coolant inlet penetrates through an area of the top wall that is surrounded by the side wall.

In a possible implementation of the first aspect, a thickness range of a jet wall is 1 mm to 2 mm.

In a possible implementation of the first aspect, a size of a port of the nozzle located in the distribution cavity is greater than a size of a port located in the collection cavity. Designs of different sizes at the two ends enable the cooling liquid in the distribution cavity to be distributed to the nozzle for ease of jet impingement.

In a possible implementation of the first aspect, the nozzle hole in the nozzle is located in the middle of the nozzle. A centered design of the nozzle hole can facilitate, during metal injection molding (MIM) technology and injection molding technology processing, molding of a protruding nozzle.

In a possible implementation of the first aspect, a length range of the nozzle extending out of the jet plate is 0.5 mm to 2 mm.

In a possible implementation of the first aspect, a hole diameter range of the port of the nozzle located in the collection cavity is 0.2 mm to 1.5 mm.

In a possible implementation of the first aspect, nozzles are uniformly distributed on the jet plate. Uniformly distributed nozzles facilitate uniform distribution of the cooling liquid onto each nozzle.

In a possible implementation of the first aspect, the nozzle holes are provided on some of the nozzles. The nozzle may be provided with the nozzle hole based on different amounts of generated heat, so as to facilitate centralized cooling of a high heat flux area.

In a possible implementation of the first aspect, the jet plate is provided with the nozzles of different sizes, and different quantities of nozzle holes are designed on the nozzles. The nozzle size may be designed based on different amounts of generated heat of the heater unit, so that a large nozzle is provided in the high heat flux area, and a plurality of nozzle holes are provided on the large nozzle, thereby helping reduce a spacing between the nozzle holes and improving a cooling effect of the area.

In a possible implementation of the first aspect, the nozzle is of a cylindrical shape, a prism shape, a circular truncated cone shape, or a frustum shape.

In a possible implementation of the first aspect, there is a gap between adjacent nozzles, and the gap forms a backflow channel for backflow of the sprayed cooling liquid. The design of the backflow channel facilitates outflow of the cooling liquid obtained through jet impingement, and improves the overall efficiency of the cooling apparatus.

In a possible implementation of the first aspect, the gap is provided on the jet plate based on a flow topology design. A shape and a position of the nozzle can be set based on the flow topology design, so as to optimize the backflow channel between nozzles.

In a possible implementation of the first aspect, the nozzle is obtained by machining, injection molding, metal injection molding, and 3D printing. Different processing methods can be used to obtain nozzles that can meet different requirements of jet impingement, so that the methods can be applied to electronic devices with different amounts of generated heat.

In a possible implementation of the first aspect, a material of the nozzle is selected from a metal material or a non-metal material. The material of the nozzle can be selected based on different jet impingement and driving forces, which can prolong service life.

In a possible implementation of the first aspect, the jet plate is fastened to the carrier plate by welding, bonding, and a screw. A plurality of different fastening manners may facilitate different selections based on a size and a requirement of the electronic device.

In a possible implementation of the first aspect, a sealing member is further disposed between the jet plate and the carrier plate. The design of the sealing member can improve a sealing effect.

In a possible implementation of the first aspect, a flow distribution plate is disposed in the distribution cavity, so as to perform flow distribution on the cooling liquid that enters the distribution cavity. In this way, a phenomenon of uneven flow distribution is avoided.

In a possible implementation of the first aspect, the distribution cavity is disposed on the carrier plate. The distribution cavity arranged according to a requirement can facilitate different processing and assembly of the carrier plate and the jet plate.

In a possible implementation of the first aspect, the carrier plate includes a top wall, a peripheral wall, and a side wall, where the coolant inlet and the coolant outlet are respectively provided on the top wall, the peripheral wall extends outward in a circumferential direction of the top wall, the top wall and the peripheral wall enclose the accommodating groove, the side wall extends outward from an interior of the accommodating groove of the top wall to surround the top wall to form the distribution cavity, and the side wall surrounds the coolant inlet; the jet plate includes a jet wall; and the jet wall is provided on the side wall and seals the distribution cavity. It is convenient to manufacture the carrier plate in a unified manner, and to design different jet plates based on a cooling requirement, so as to improve production efficiency, and flexibly design the cooling apparatus.

In a possible implementation of the first aspect, the jet wall is provided on the side wall by using the sealing member. The design of the sealing member can improve the sealing effect.

In a possible implementation of the first aspect, the cooling apparatus further includes a communicating pipe and an isolation plate, one end of the communicating pipe communicates with the coolant inlet, the other end of the communicating pipe communicates with a through hole provided on the isolation plate, the distribution cavity includes the isolation plate, the jet plate, and the side wall that surrounds the jet plate, and the isolation plate, the top wall, and the peripheral wall enclose the collection cavity.

In a possible implementation of the first aspect, the communicating pipe is provided on the top wall by using the sealing member. The design of the sealing member can improve the sealing effect.

In a possible implementation of the first aspect, the communicating pipe is provided on the top wall by welding. Welding connection can improve a sealing connection effect between the communicating pipe and the top wall.

In a possible implementation of the first aspect, an isolation chamber is further disposed on the isolation plate, the isolation chamber is in communication with the communicating pipe, and the distribution cavity is in communication with the isolation chamber. A design of the isolation chamber can increase an amount of contained cooling liquid, thus improving density and uniformity of the jet.

In a possible implementation of the first aspect, the jet plate is provided on the isolation plate by using the sealing member. The design of the sealing member can improve the sealing effect.

In a possible implementation of the first aspect, the isolation plate is integrally formed on the carrier plate, the distribution cavity is disposed on the isolation plate, the jet plate includes the jet wall, and the jet wall is provided on the isolation plate and seals the distribution cavity. An integrated design can be used for manufacturing the carrier plate in the unified manner, and designing different jet plates based on the cooling requirement, so as to improve the production efficiency, and flexibly design the cooling apparatus.

According to a second aspect of this embodiment of this disclosure, an electronic device is provided, including a circuit board, a heater unit, and a cooling apparatus, where the heater unit is provided on the circuit board, the cooling apparatus is the cooling apparatus according to any one of the first aspect and the possible implementations, the carrier plate is provided on the circuit board, the heater unit is provided in the collection cavity, and the jet plate is provided on a surface that is of the carrier plate and that faces the heater unit.

The electronic device has a simple structure and is easy to process. The heater unit is sealed in the collection cavity. It is only necessary to dispose the nozzle on the jet plate, and to dispose the distribution cavity between the jet plate and the carrier plate, and then jet cooling of the heater unit can be implemented through the nozzle. In this way, processing is convenient, and processing costs are reduced.

In a possible implementation of the second aspect, the carrier plate is provided on the circuit board by using the sealing member. The design of the sealing member can improve the sealing effect.

In a possible implementation of the second aspect, there is a gap between the nozzle and the heater unit, to form a jet chamber in the collection cavity.

In a possible implementation of the second aspect, a distance between the nozzle and the heater unit ranges from 0.2 mm to 1.5 mm.

In a possible implementation of the second aspect, a sputtering layer is provided on the heater unit. The sputtering layer can implement waterproof sealing of the heater unit, thereby improving safety performance.

In a possible implementation of the second aspect, the sputtering layer is formed by sputtering on a surface of the heater unit.

In a possible implementation of the second aspect, the heater unit is further provided with a resin layer. Arrangement of the resin layer can improve a waterproof effect of the heater unit.

In a possible implementation of the second aspect, the cooling apparatus further includes a mounting bracket, where the mounting bracket is disposed on the circuit board and surrounds the heater unit, and the carrier plate is provided on the mounting bracket. The mounting bracket may be a metal reinforcing plate (Stiffener reinforcing rib, Ring, made of stainless steel or copper) of the heater unit (such as a chip) of the electronic device, or may be a mounting bracket provided additionally, so as to be installed according to the requirement.

In a possible implementation of the second aspect, the mounting bracket is provided on the circuit board by using the sealing member, to seal the heater unit in the collection cavity. The design of the sealing member can improve the sealing effect.

In a possible implementation of the second aspect, the carrier plate is provided on the mounting bracket by using the sealing member. A design of the sealing member such as a sealing adhesive or an O-ring can improve the sealing effect.

In a possible implementation of the second aspect, a mounting surface is provided on a side that is of the mounting bracket and that is away from the circuit board, and the carrier plate is provided on the mounting surface. The design of the mounting surface facilitates installation of the cooling apparatus and improves assembly efficiency.

REFERENCE NUMERALS OF MAIN COMPONENTS

| Cooling apparatus | 100, 300, 400, 600, 800, and 903 |
|---|---|
| Carrier plate | 10 |
| Top wall | 101 |
| Peripheral wall | 102 |
| Coolant inlet | 11 |
| Coolant outlet | 12 |
| Accommodating groove | 13 |
| Jet chamber | 131 |
| Liquid inlet pipe | 14 |
| Liquid outlet pipe | 15 |
| Jet plate | 20 |
| Distribution cavity | 21 |
| Distribution hole | 211 |
| Nozzle | 22 |
| Nozzle hole | 221 |
| Jet wall | 23 |
| Side wall | 24 |
| Sealing member | 30 |
| Isolation plate | 40 |
| Communicating pipe | 41 |
| Communicating hole | 411 |
| Isolation chamber | 42 |
| Electronic device | 200, 500, 700, and 900 |
| Circuit board | 201 |
| Heater unit | 202 |
| Mounting bracket | 203 |
| Sputtering layer | 204 |
| Resin layer | 205 |
| Mounting surface | 704 |

The present invention is further described with reference to the accompanying drawings in the following specific embodiments.

DESCRIPTION OF EMBODIMENTS

The following describes technical solutions in embodiments of this disclosure with reference to accompanying drawings in embodiments of this disclosure.

The following terms "first", "second", and the like are merely used for description, and shall not be understood as an indication or implication of relative importance or implicit indication of a quantity of indicated technical features. Therefore, a feature limited by "first" or "second" may explicitly or implicitly include one or more features. In the descriptions of this disclosure, unless otherwise stated, "a plurality of" means two or more than two. Orientation terms such as "up", "down", "left", and "right" are defined relative to an orientation of schematic placement of components in the accompanying drawings. It should be understood that these directional terms are relative concepts and are used for relative description and clarification. These directional terms may vary accordingly depending on an orientation in which the components are placed in the accompanying drawings.

In this disclosure, unless otherwise explicitly specified and limited, a term "connection" should be understood in a broad sense. For example, the "connection" may be a fastened connection, a detachable connection, or an integrated connection; and may be a direct connection or an indirect connection by using an intermediate medium. The term "and/or" used in this specification includes any and all combinations of one or more related listed items.

When the following embodiments are described in detail with reference to schematic diagrams, for ease of description, a diagram indicating a partial structure of a component is partially enlarged not based on a general scale. In addition, the schematic diagrams are merely examples, and should not limit the protection scope of this disclosure herein.

Embodiment 1

Figure 1:
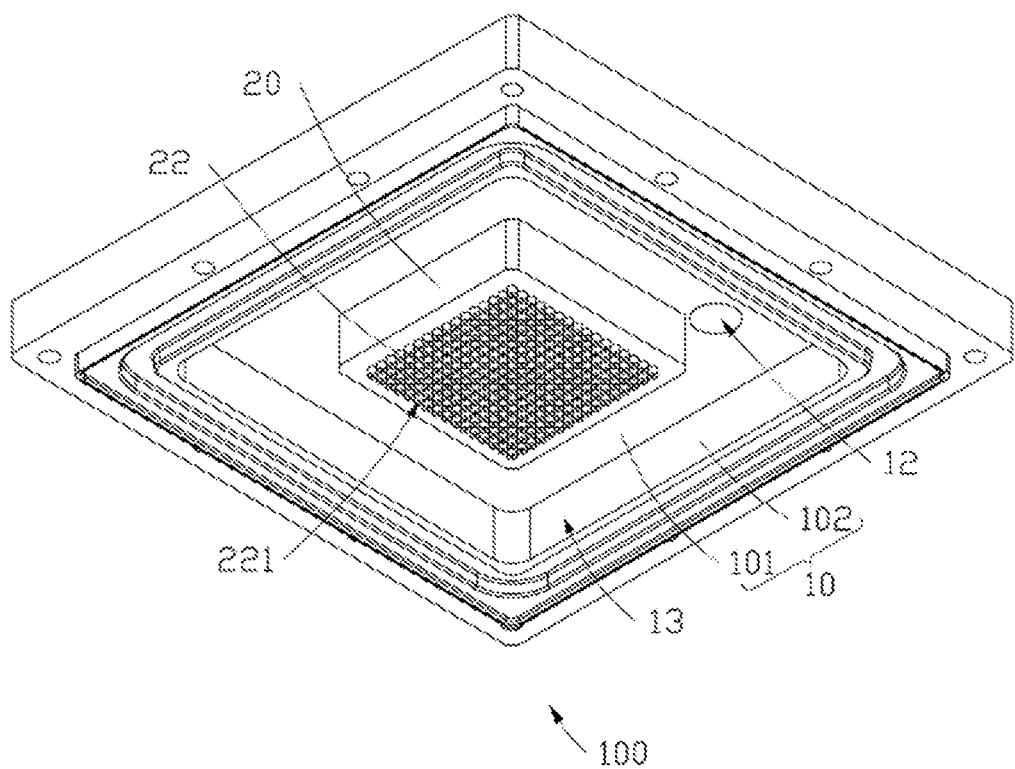
FIG. 1 is a stereoscopic schematic diagram of a cooling apparatus according to a first embodiment of this disclosure.
Figure 2:
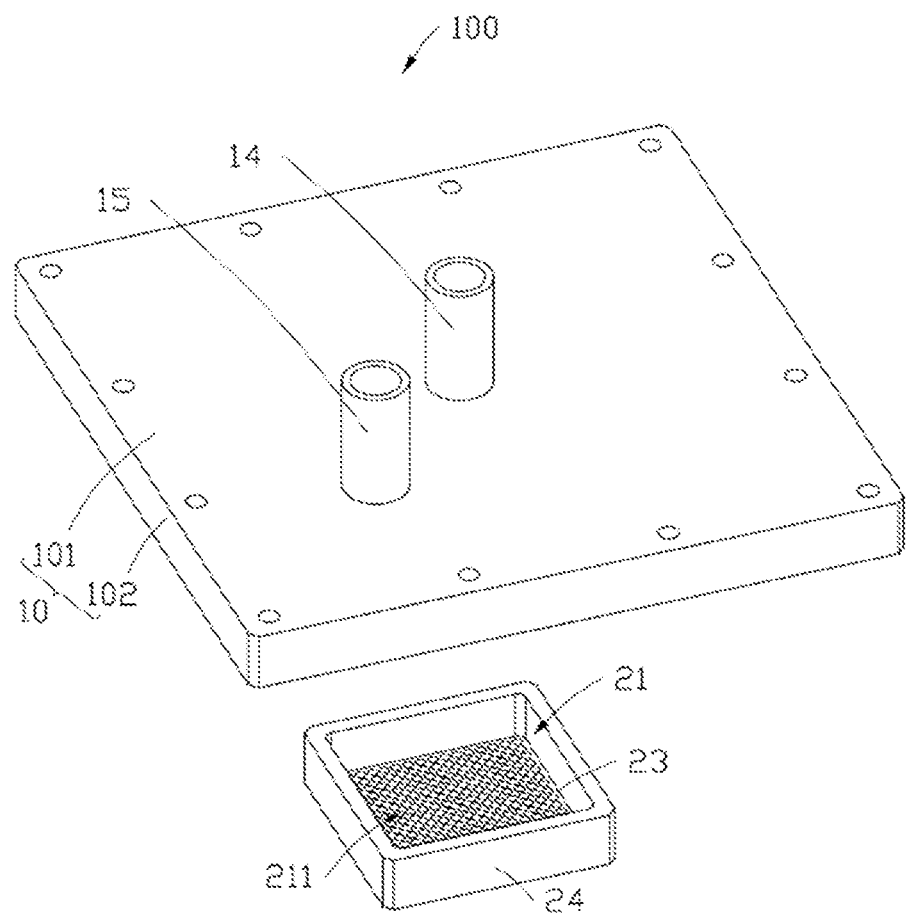
FIG. 2 is a three-dimensional exploded view of the cooling apparatus shown in FIG. 1 from another perspective.
Figure 3:
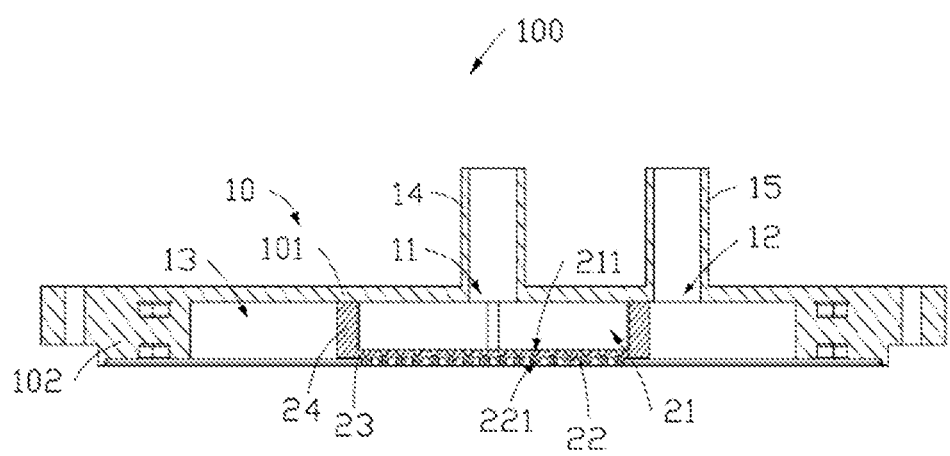
FIG. 3 is a schematic cross-sectional diagram of a structure of the cooling apparatus shown in FIG. 1.

FIG. 1 to FIG. 3 show a cooling apparatus 100 according to a first embodiment of this disclosure. The cooling apparatus 100 is configured to cool a heater unit, especially a high heat flux density chip or a power device such as a CPU in an electronic device.

The cooling apparatus 100 includes a carrier plate 10 and a jet plate 20. The jet plate is provided on the carrier plate 10. The carrier plate 10 is for entry and exit of cooling liquid. The jet plate 20 is configured to form a jet by using the cooling liquid that enters the cooling apparatus 100, and spray the jet onto the heater unit, so as to cool the heater unit.

A distribution cavity 21 is disposed on a side that is of the jet plate 20 and that is close to the carrier plate 10. The carrier plate 10 is provided with a coolant inlet 11 and a coolant outlet 12. The coolant inlet 11 is configured to inject the cooling liquid. The coolant outlet 12 is for outflow of the cooling liquid obtained through jet impingement. The distribution cavity 21 communicates with the coolant inlet 11. The distribution cavity 21 is configured to accommodate the cooling liquid and distribute the cooling liquid to the jet plate 20. A plurality of nozzles 22 are provided on the jet plate 20 in a protruding manner. The nozzle 22 is provided on a side that is of the jet plate 20 and that is away from the carrier plate 10. The nozzle 22 is configured to spray the cooling liquid in the distribution cavity 21 to the heater unit, so as to cool the heater unit.

The carrier plate 10 is provided with an accommodating groove 13. The jet plate 20 is provided in the accommodating groove 13. A collection cavity for cooling liquid backflow is formed in the accommodating groove 13. The collection cavity is separated from the distribution cavity 21. The coolant outlet 12 communicates with the collection cavity. The coolant outlet 12 is for outflow of the cooling liquid that flows into the collection cavity after being sprayed from the nozzle 22. The collection cavity can seal the sprayed cooling liquid, to prevent the cooling liquid from flowing out of a remaining part of the carrier plate 10.

The carrier plate 10 includes a top wall 101 and a peripheral wall 102. The peripheral wall 102 extends outward perpendicular to the top wall 101 in a circumferential direction of the top wall 101. The peripheral wall 102 surrounds the top wall 101 to form the accommodating groove 13. The coolant inlet 11 and the coolant outlet 12 are both provided on the top wall 101.

The jet plate 20 includes a jet wall 23. The distribution cavity 21 includes the jet wall 23 and a side wall 24 that surrounds the jet wall 23. The side wall 24 is perpendicular to the jet wall 23. The jet wall 23 and the side wall 24 are integrated. One end of the side wall 24 is in contact with the jet plate 20, and the other end of the side wall 24 is in contact with the top wall 101. In addition, the coolant inlet 11 penetrates through an area that is of the top wall 101 and that is surrounded by the side wall 24. The coolant outlet 12 penetrates through an area that is of the top wall 101 and that is not surrounded by the side wall 24. An area of a region surrounded by the side wall 24 on the top wall 101 is less than an area of the top wall 101.

A liquid inlet pipe 14 and a liquid outlet pipe 15 are disposed on a side that is of the carrier plate 10 and that is away from the accommodating groove 13. The coolant inlet 11 communicates with the liquid inlet pipe 14. The coolant outlet 12 communicates with the liquid outlet pipe 15. The liquid inlet pipe 14 is configured to communicate with an external cooling liquid delivery pipe. The liquid outlet pipe 15 is configured to communicate with an external cooling liquid recovery pipe.

The nozzle 22 extends from the jet wall 23 to a side away from the carrier plate 10. The jet wall 23 is provided with a nozzle hole 221. The nozzle hole 221 penetrates through the jet wall 23 and the nozzle 22, to connect the distribution cavity 21 and the collection cavity. The nozzle hole 221 is configured to jet, driven by power, the cooling liquid in the distribution cavity 21 onto a surface of the heater unit, so that the surface of the heater unit that is impacted generates a strong heat exchange effect.

There is a gap between two adjacent nozzles 22, and the gap forms a backflow channel for the cooling liquid to flow back after the jet impingement.

When used, the carrier plate 10 is provided on the electronic device, and the heater unit is sealed in the collection cavity. The cooling liquid flows into the coolant inlet 11 through the liquid inlet pipe 14, enters the distribution cavity 21, and is distributed in the distribution cavity 21 to each nozzle hole 221 located in the jet wall 23. Then, driven by an external driving force (for example, a pump), the cooling liquid distributed to the nozzle holes 221 is respectively sprayed to the surface of the heater unit through the nozzle hole 221, so as to be in contact with the surface of the heater unit and impact the surface of the heater unit, generate an effect of forced convection heat transfer with a region that is directly impacted, and absorb heat of the heater unit. Subsequently, a part of the sprayed cooling liquid is blocked by the surface of the heater unit, and returns in a direction of the jet plate 20, and flows out of the jet plate 20 from the gap between the nozzles 22 to a periphery of the heater unit, and remaining cooling liquid flows directly from the surface of the heater unit to the periphery of the heater unit. Finally, the cooling liquid flowing around the heater unit is collected, flows into the liquid outlet pipe 15 from the coolant outlet 12, and is then sent out of the cooling apparatus 100 to complete cooling of the heater unit.

The nozzle 22 of the jet plate 20 is manufactured by using a process such as machining, injection molding, metal injection molding, and 3D printing. A material of the nozzle 22 may be a metal material or a non-metal material.

A thickness range of the jet wall 23 of the jet plate 20 is 1 mm to 2 mm Preferably, thickness of the jet wall 23 is 1.5 mm A length range of the nozzle 22 extending out of the jet wall 23 is 0.5 mm to 2 mm Preferably, an extension length of the nozzle 22 is 1 mm A hole diameter range of the nozzle hole 221 is 0.2 mm to 1.5 mm Preferably, a hole diameter of the nozzle hole 221 is 0.35 mm.

The nozzle 22 may be of a cylindrical shape, a prism shape, a circular truncated cone shape, or a frustum shape. When the nozzle 22 is of the cylindrical shape, a wall thickness range of the nozzle 22 is 0.15 mm to 0.25 mm Preferably, the wall thickness of the nozzle 22 is 0.2 mm. When the nozzle 22 is of a quadrangular prism shape, the wall thickness range of the nozzle 22 is 0.15 mm to 0.35 mm Preferably, the wall thickness of the nozzle 22 is 0.25 mm.

A distribution hole 211 is further formed at an end that is of the nozzle hole 221 and that is close to the distribution cavity 21. A hole diameter of the distribution hole 211 is greater than a hole diameter of an opening at one end of the nozzle hole 221 that is close to the collection cavity, that is, a size of a port of the nozzle 22 located in the distribution cavity 21 is greater than a size of a port located in the collection cavity. The distribution hole 211 is configured to converge the cooling liquid in the distribution cavity 21 into the nozzle hole 221, so as to facilitate the jet impingement performed by the nozzle 22.

In an embodiment, the distribution hole 211 is substantially conical. The distribution hole 211 may also be of a cylindrical shape, a prism shape, a frustum shape, or the like. Preferably, the nozzle hole 221 is located in the middle of the distribution hole 211. A centered design of the nozzle hole can facilitate, during metal injection molding (MIM) technology and injection molding technology processing, molding of a protruding nozzle.

In an embodiment, the jet plate 20 is fastened on the carrier plate 10 by welding, bonding, screw connection, or the like.

In an embodiment, a sealing member such as a sealing adhesive and a seal ring is further disposed between the jet plate 20 and the carrier plate 10, so as to prevent the cooling liquid from flowing out between the jet plate 20 and the carrier plate 10.

In an embodiment, a flow distribution plate (not shown in the figure) may be configured in the distribution cavity 21, so as to distribute the cooling liquid that enters the distribution cavity 21, and then the cooling liquid flows into each nozzle 22, thereby avoiding a phenomenon of uneven flow distribution.

The cooling apparatus 100 has a simple structure. By disposing the distribution cavity 21 on the jet plate 20, disposing the accommodating groove 13 on the carrier plate 10, disposing the nozzle 22 with the nozzle hole 221 on the side that is of the jet plate 20 and that is away from the carrier plate 10, and using the backflow channel formed by the gap between the nozzles 22, backflow and outflow of the cooling liquid can be implemented through the collection cavity formed by the accommodating groove 13 and the heater unit. The cooling liquid in the distribution cavity 21 is jetted to the heater unit by using the nozzle 22. In this way, an effect of forced convection heat transfer is strong, a heat dissipation effect is good, a processing precision requirement is low, installation is simple, and processing is convenient, thereby reducing processing costs.

In a specific implementation of this disclosure, the cooling liquid may be cooling water. Another cooling liquid suitable for the heater unit, especially suitable for the electronic device, such as fluorinert electronic liquid or another liquid coolant, may also be selected.

Embodiment 2

Figure 4:
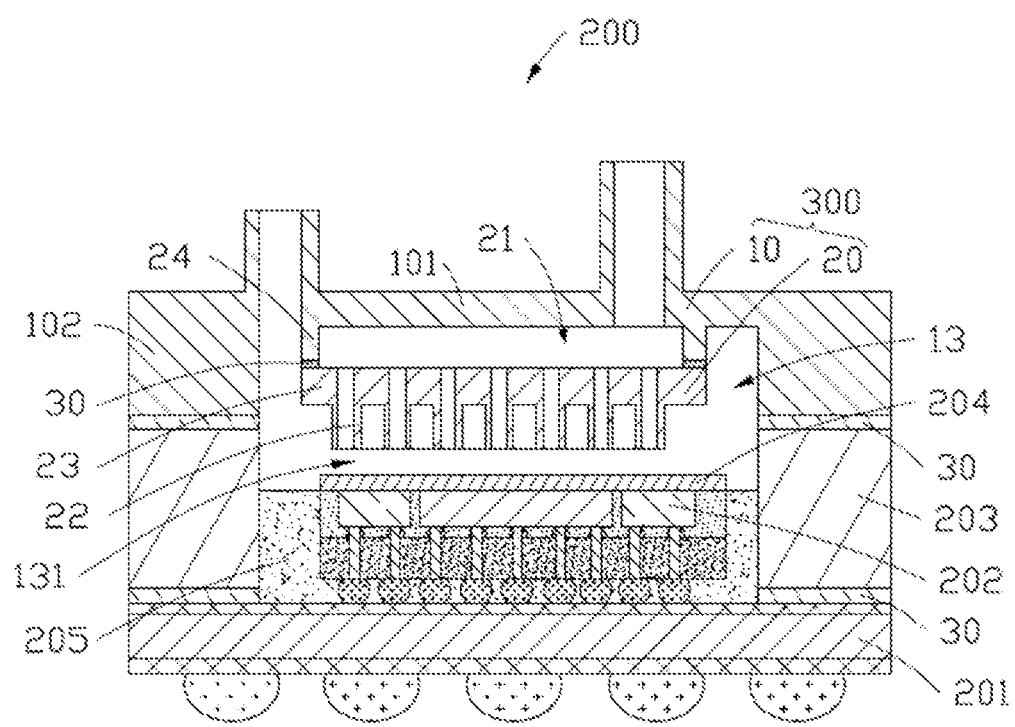
FIG. 4 is a schematic cross-sectional diagram of a structure of an electronic device according to a second embodiment of this disclosure.

FIG. 4 shows an electronic device 200 according to a second embodiment of this disclosure. The electronic device 200 is provided with a cooling apparatus 300.

Specifically, the electronic device 200 includes a circuit board 201, a heater unit 202, a mounting bracket 203, and the cooling apparatus 300. The heater unit 202 is provided on the circuit board 201. The mounting bracket 203 is provided on the circuit board 201 and surrounds the heater unit 202. A carrier plate 10 of the cooling apparatus 300 is provided on the mounting bracket 203. A jet plate 20 of the cooling apparatus 300 is provided on a side of the carrier plate that is close to the heater unit 202.

The cooling apparatus 300 differs from the cooling apparatus 100 in the first embodiment shown in FIG. 1 mainly in that a distribution cavity 21 is disposed on the carrier plate 10.

Specifically, the distribution cavity 21 includes a top wall 101 and a side wall 24 that surrounds the top wall 101. The side wall 24 extends downward perpendicular to the top wall 101 from an interior of the accommodating groove 13 of the top wall 101. The jet plate 20 is substantially flat-plate shaped and includes a jet wall 23. The jet wall 23 is provided on the side wall 24 and seals the distribution cavity 21.

In an embodiment, the side wall 24 is separated from the jet wall 23, and the side wall 24 is integrated with the carrier plate 10. The jet wall 23 is provided on the side wall 24 by using a sealing member 30 such as a sealing adhesive and an O-ring, to seal the distribution cavity 21.

In an embodiment, a nozzle 22 of the jet wall 23 is opposite to the heater unit 202.

There is a gap between the nozzle 22 and the heater unit 202, to form a jet chamber 131 for jetting in the collection cavity formed by the accommodating groove 13. The jet chamber 131 is configured to emit the cooling liquid sprayed in the nozzle hole 221 to the heater unit 202 for heat exchange, so as to take away heat on the heater unit 202.

Specifically, a distance between the nozzle 22 and the heater unit, that is, a thickness (a jet height (Height) or a jet gap (gap)) of the jet chamber 131 ranges from 0.2 mm to 1.5 mm Preferably, the distance is 0.5 mm.

In an embodiment, the heater unit 202 may be a high heat flux density chip or a power device such as a CPU. The circuit board 201 is a substrate of the power device such as a chip.

In an embodiment, the heater unit 202 is welded to the circuit board 201 by using a solder and is electrically connected to the circuit board 201.

In an embodiment, a surface of the heater unit 202 may be further processed by using a sputtering metal or another material (such as SiN) process to form a sputtering layer 204. The sputtering layer 204 may implement sealing of the heater unit 202, thereby achieving a waterproof effect.

In an embodiment, a periphery of the heater unit 202 may be filled with or coated with epoxy resin to form a resin layer 205 between the heater unit 202 and the mounting bracket 203, thereby improving the waterproof effect of the heater unit 202.

The mounting bracket 203 may be a metal reinforcing plate (Stiffener reinforcing rib, Ring, made of stainless steel or copper) of the heater unit (such as a chip) of the electronic device 200. In an embodiment, the mounting bracket 203 may also be a frame that is additionally disposed and configured to install the cooling apparatus.

In an embodiment, the mounting bracket 203 may be sealed on the circuit board 201 on which the heater unit 202 is installed by using the sealing member 30 such as the sealing adhesive and the O-ring, so as to cooperate with the peripheral wall 102 to seal the heater unit 202 in the collection cavity.

In an embodiment, the peripheral wall 102 is provided on the mounting bracket 203 by using the sealing member 30 such as the sealing adhesive and the O-ring.

The electronic device 200 has a simple structure, and the carrier plate 10 is integrally formed, which facilitates processing. It is only necessary to dispose the nozzle 22 with the nozzle hole 221 on the jet plate 20, and to seal the heater unit 202 in the collection cavity by using the sealing member 30, and then the jet cooling of the heater unit 202 can be implemented through the nozzle 22, which facilitates processing and reduces the processing costs.

Embodiment 3

Figure 5:
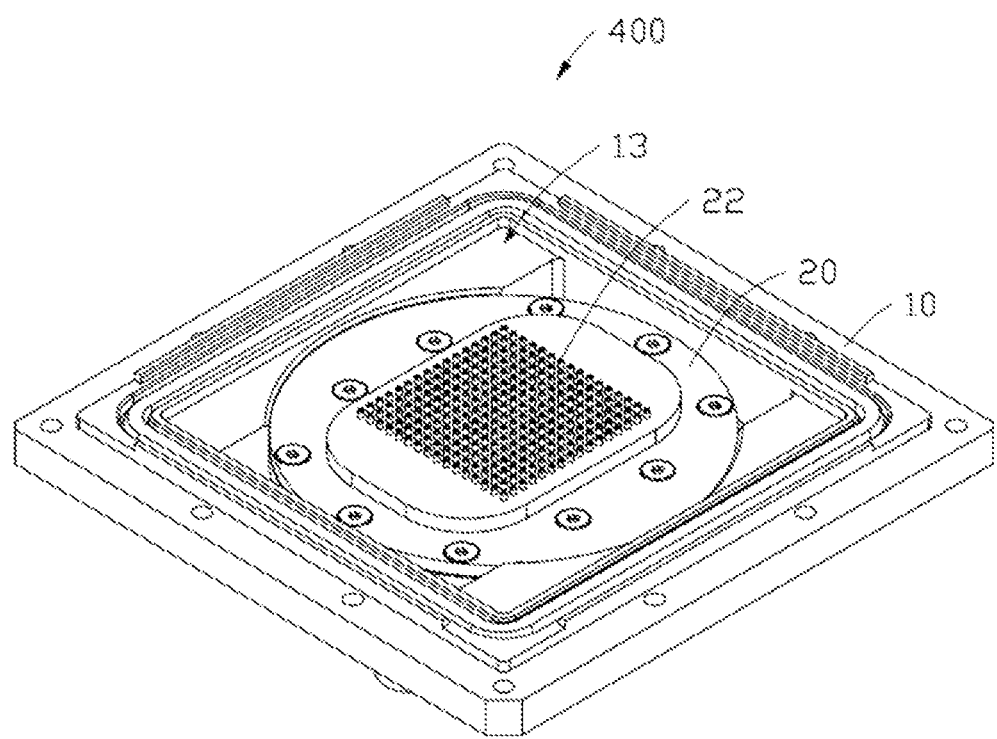
FIG. 5 is a stereoscopic schematic diagram of a cooling apparatus according to a third embodiment of this disclosure.
Figure 6:
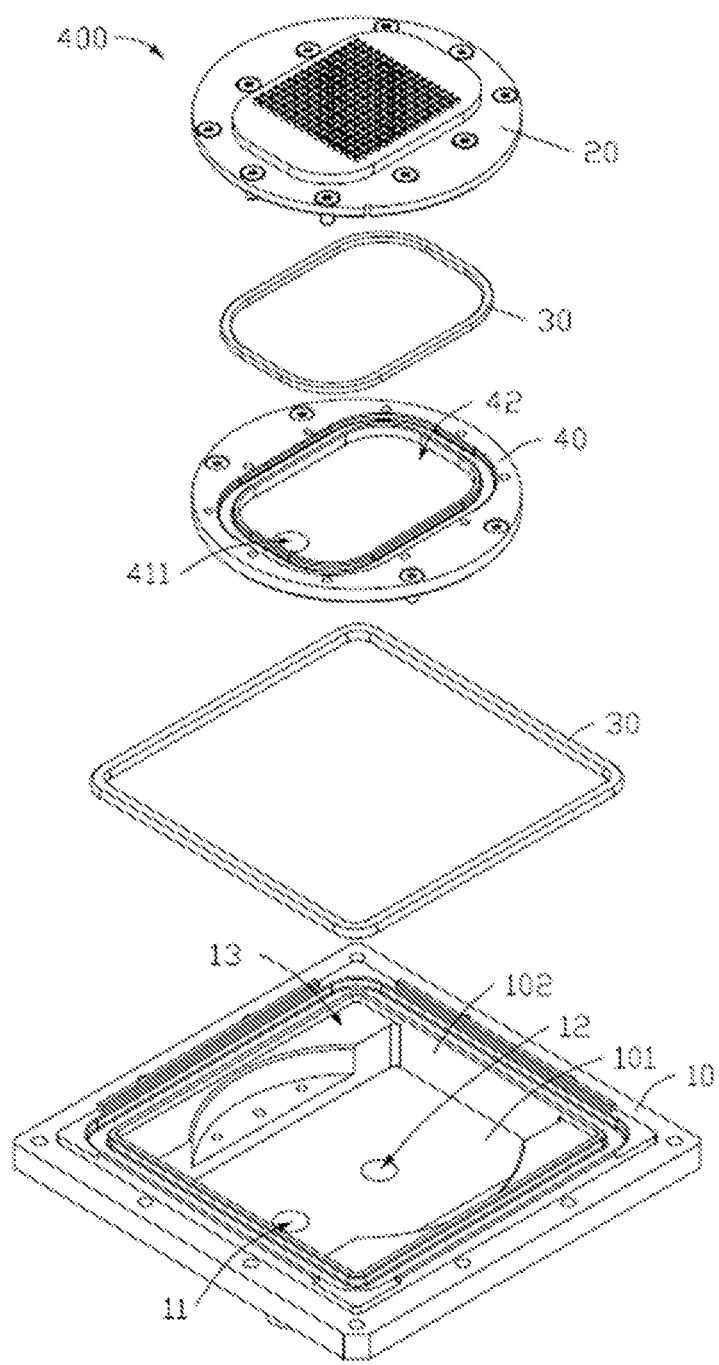
FIG. 6 is a stereoscopic schematic exploded diagram of the cooling apparatus shown in FIG. 5.
Figure 7:
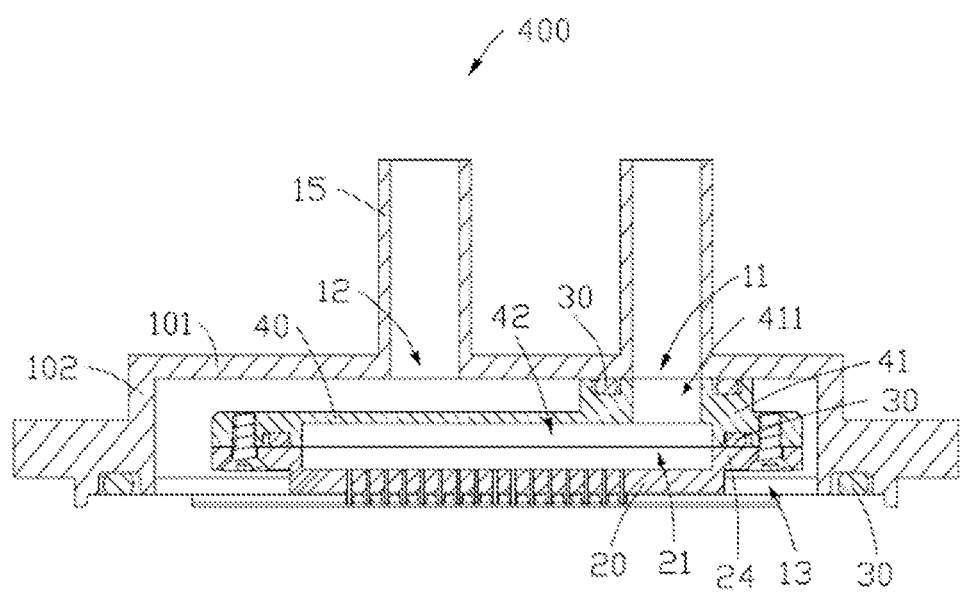
FIG. 7 is a schematic cross-sectional diagram of a structure the cooling apparatus shown in FIG. 5.

FIG. 5 to FIG. 7 show a cooling apparatus 400 according to a third embodiment of this disclosure.

The cooling apparatus 400 differs from the cooling apparatus 100 in the first embodiment shown in FIG. 1 mainly in that the cooling apparatus 400 further includes an isolation plate 40. The isolation plate 40 is provided in an accommodating groove 13 and is located on a side of a distribution cavity 21 that is close to a top wall 101. The isolation plate 40, a jet plate 20, and a side wall 24 enclose the distribution cavity 21. The isolation plate 40, the top wall 101, and a peripheral wall 102 enclose a collection cavity. The isolation plate 40 separates the distribution cavity 21 from the top wall 101, so that a coolant outlet 12 and a liquid outlet pipe 15 can be flexibly provided on the top wall 101.

Specifically, the cooling apparatus 400 further includes a communicating pipe 41. The communicating pipe 41 is provided with a communicating hole 411, one end of the communicating pipe 41 communicates with a coolant inlet 11, and the other end of the communicating pipe 41 communicates with a through hole provided on the isolation plate 40.

In an embodiment, the isolation plate 40 is further provided with an isolation chamber 42. The isolation chamber 42 communicates with the communicating hole 411. The jet plate 20 is provided on the isolation plate 40, and the distribution cavity 21 communicates with the isolation chamber 42.

In an embodiment, the communicating pipe 41 is disposed on a carrier plate 10 by using a screw, and the communicating pipe 41 is sealed with the top wall 101 by using the sealing member 30. The communicating pipe 41 may further be disposed on the top wall 101 by welding, so as to implement connection and sealing between the communicating pipe 41 and the carrier plate 10.

In an embodiment, the jet plate 20 is provided on the isolation plate 40 by using a screw and is sealed with the isolation plate 40 by using the sealing member 30.

In an embodiment, the carrier plate 10 is provided on the electronic device by using the sealing member 30.

The cooling apparatus 400 has a simple structure. One isolation plate 40 is added to the accommodating groove 13 to separate the distribution cavity 21 from the top wall 101, so that the coolant outlet 12 and the liquid outlet pipe 15 may be disposed at any position on the top wall 101 of the carrier plate 10, which facilitates flexible design of the liquid outlet pipe 15, and can improve a problem of uneven flow caused by a shift of an outlet position of the cooling liquid.

Figure 8:
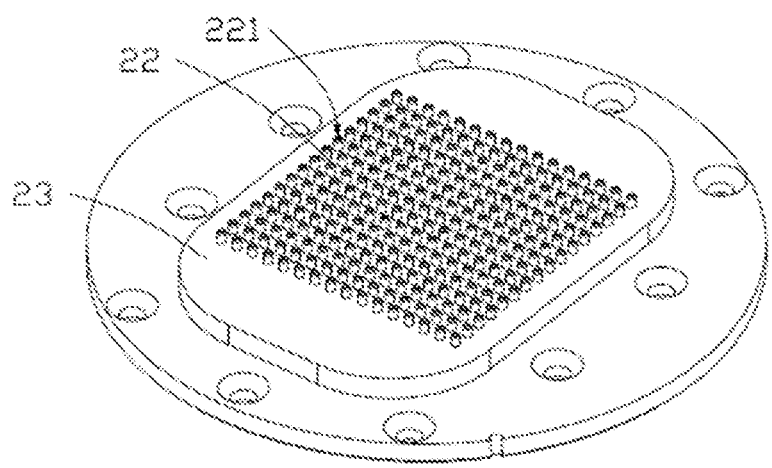
FIG. 8 is a stereoscopic schematic diagram of a jet plate of the cooling apparatus shown in FIG. 5.
Figure 9:
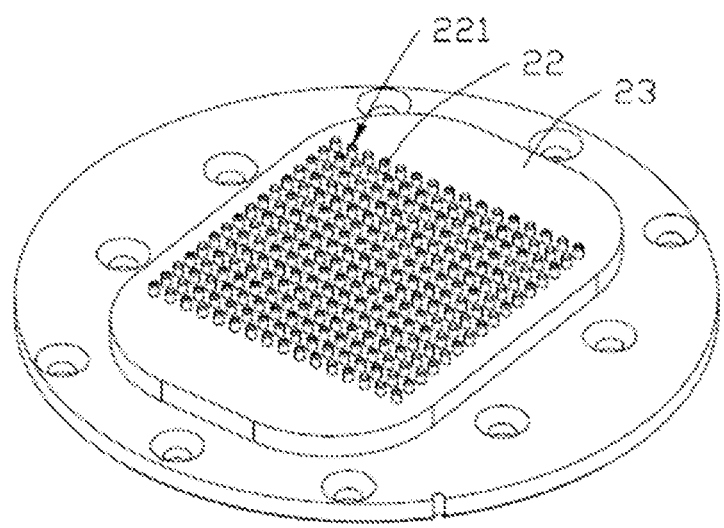
FIG. 9 is another stereoscopic schematic diagram of the jet plate of the cooling apparatus shown in FIG. 5.

In an embodiment, as shown in FIG. 8, the nozzles 22 may be evenly distributed on a jet wall 23, and each of the nozzles 22 is provided with the nozzle hole 221. As shown in FIG. 9, some of the nozzles 22 may be further provided with the nozzle hole 221, or after all of the nozzles 22 are provided with the nozzle hole 221, some of nozzle holes 221 are sealed by using a filler such as the sealing adhesive, so that a position of the nozzle hole 221 on the jet wall 23 is flexibly disposed. Therefore, the position of the nozzle hole 221 may be selectively disposed on the jet plate 20 based on different amounts of generated heat of the heater unit.

Figure 10:
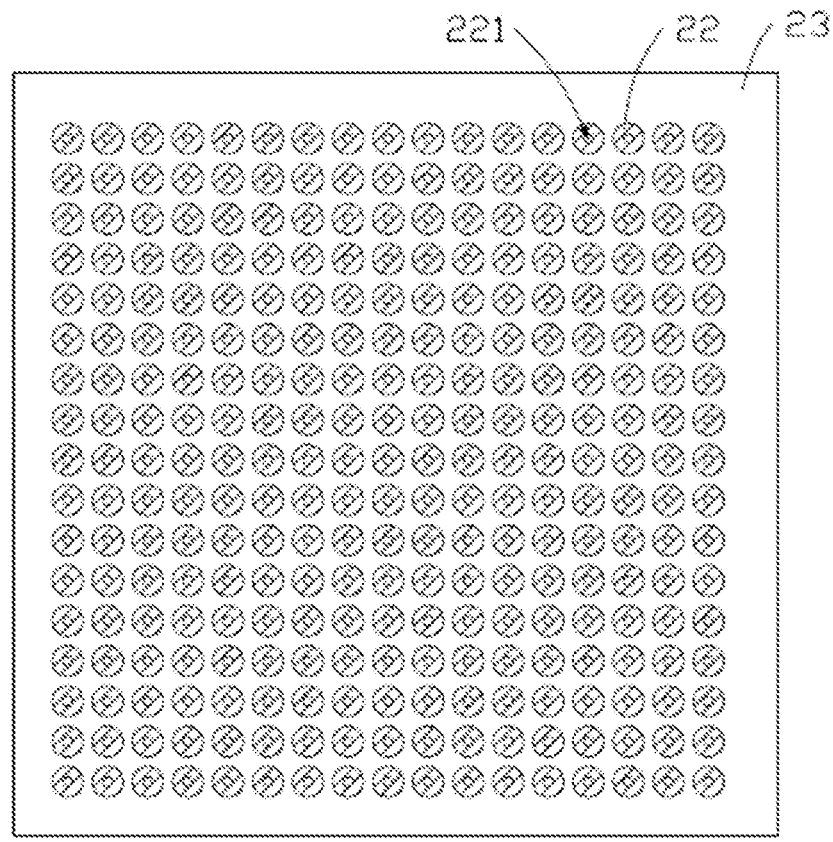
FIG. 10 is a schematic diagram of a structure of nozzle distribution of a jet plate.
Figure 11:
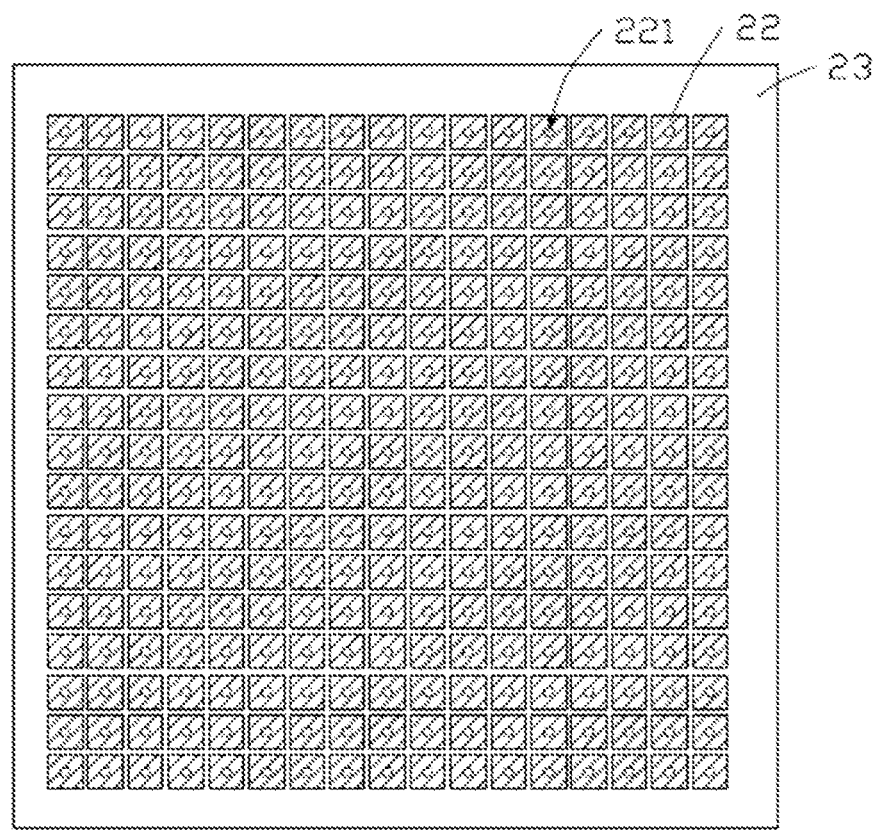
FIG. 11 is a second schematic diagram of a structure of nozzle distribution of a jet plate.

In an embodiment, as shown in FIG. 10 and FIG. 11, the nozzle 22 may be of a cylindrical shape, a prism shape, a circular truncated cone shape, a frustum shape, or the like that is evenly distributed. In this case, preferably, the nozzle hole 221 is provided in the middle of the nozzle 22. The nozzles 22 of different shapes may also be provided on the jet wall 23 in a mixed manner.

Figure 12:
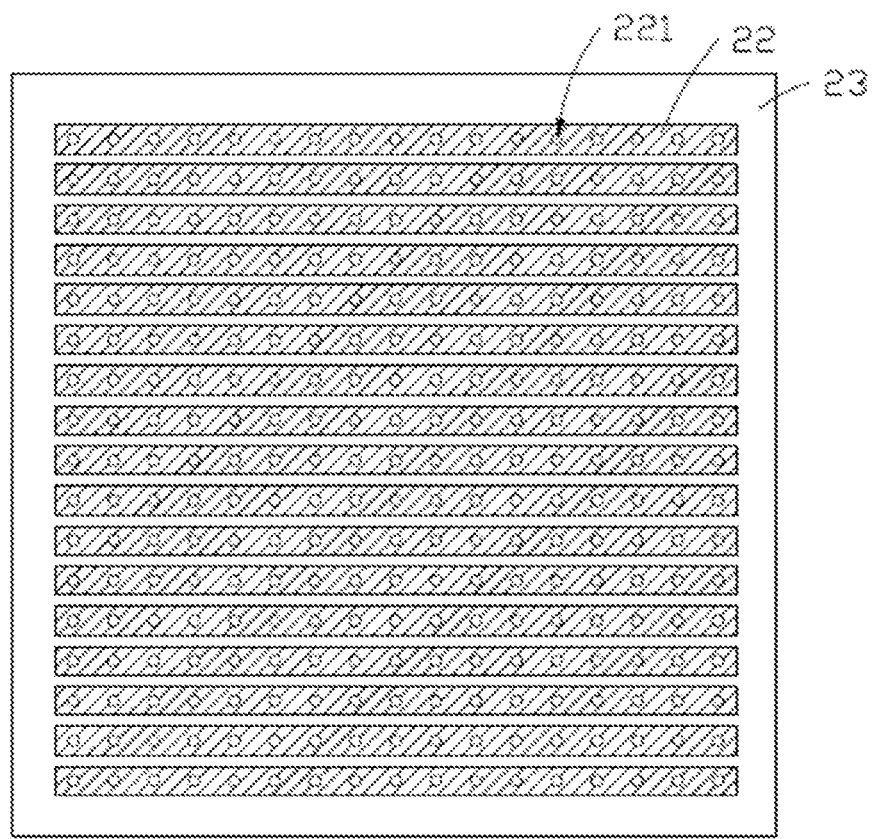
FIG. 12 is a third schematic diagram of a structure of nozzle distribution of a jet plate.

In an embodiment, as shown in FIG. 12, a gap between the nozzles 22 may be further set to be of a strip shape, a wave shape, or the like based on a flow topology design. In this case, a plurality of nozzle holes 221 may be provided on one of the nozzles 22 according to a requirement.

Figure 13:
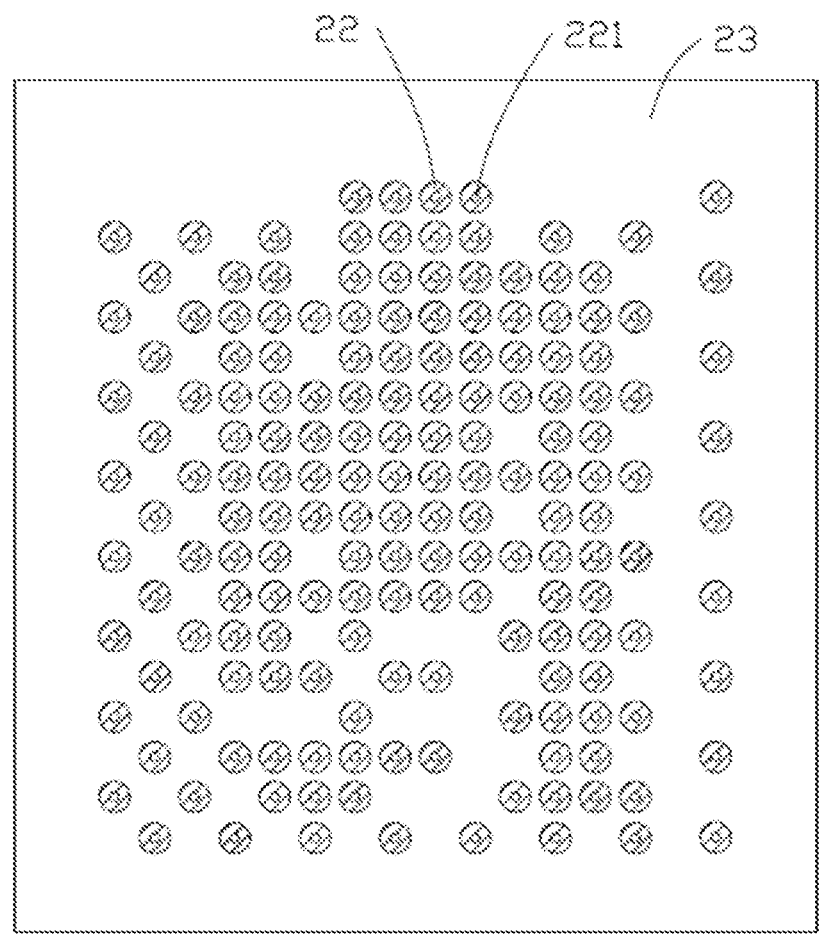
FIG. 13 is a fourth schematic diagram of a structure of nozzle distribution of a jet plate.

In an embodiment, as shown in FIG. 13, a position of the nozzle 22 may be further designed based on the amount of generated heat of the heater unit. For example, when the heater unit is the chip, different quantities of nozzle holes 221 may be designed based on distribution (power map) of a power region of the chip. In this case, the nozzle holes 221 may be provided on each of the nozzles 22.

Figure 14:
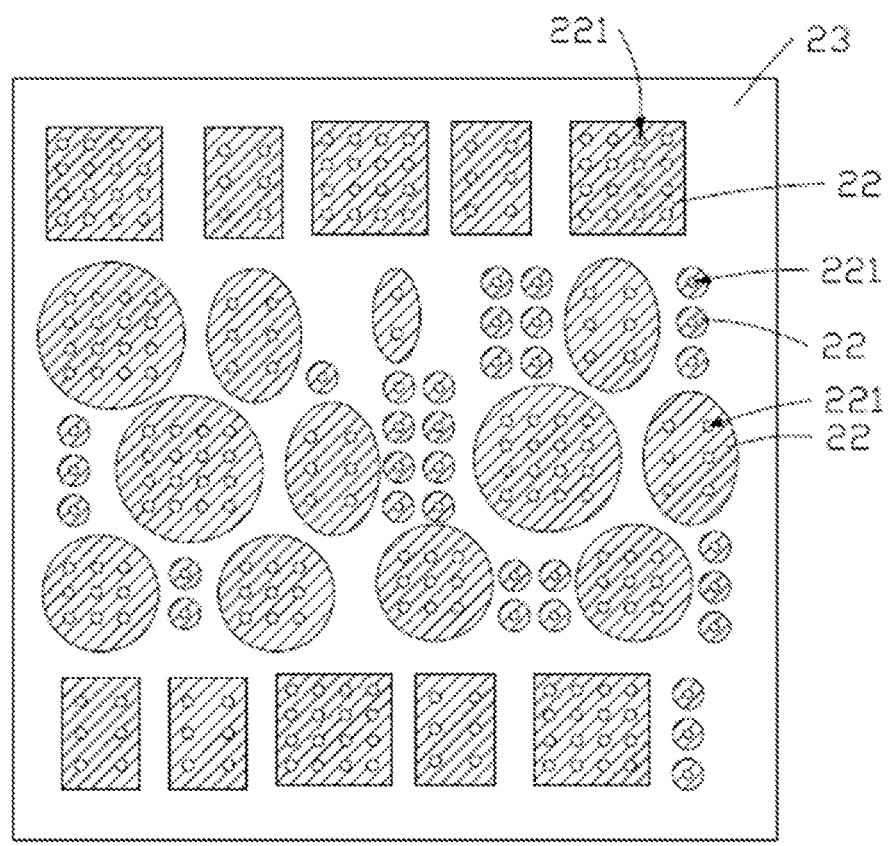
FIG. 14 is a fifth schematic diagram of a structure of nozzle distribution of a jet plate.

In an embodiment, as shown in FIG. 14, the nozzle 22 may be further designed based on the amount of generated heat of the heater unit. For example, the nozzles 22 of different sizes may be designed based on the distribution of the power region of the chip. In this case, the different quantities of nozzle holes 221 may be designed on different nozzles 22. In this case, because the plurality of nozzle holes 221 are provided on one nozzle 22, a spacing between the nozzle holes 221 may be set to be smaller, so that more nozzle holes 221 may be distributed in a high power density region, thereby performing strong cooling on the high power density region.

The nozzle 22 and the nozzle hole 221 are flexibly designed to meet heat dissipation requirements of different heater units, thereby improving cooling efficiency of the cooling liquid.

Embodiment 4

Figure 15:
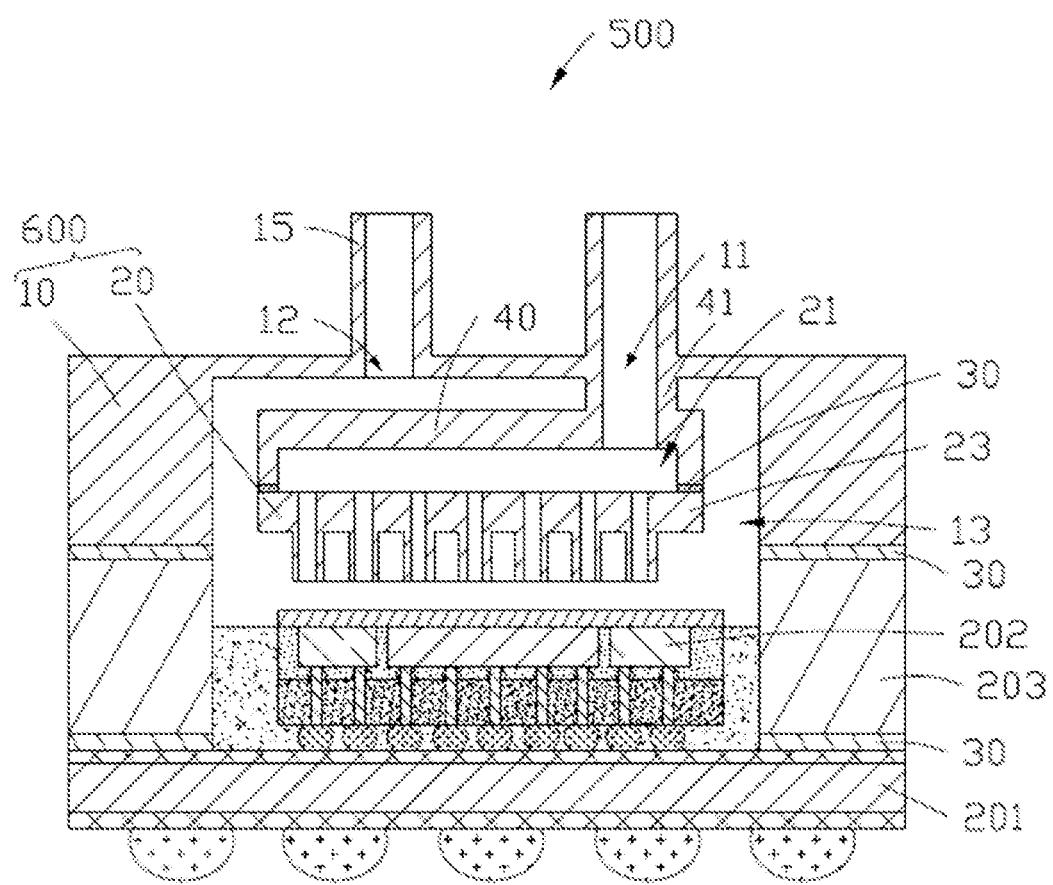
FIG. 15 is a schematic cross-sectional diagram of a structure of an electronic device according to a fourth embodiment of this disclosure.

FIG. 15 shows an electronic device 500 according to a fourth embodiment of this disclosure. The electronic device 500 is provided with a cooling apparatus 600.

The cooling apparatus 600 differs from the cooling apparatus 400 in the third embodiment shown in FIG. 5 mainly in that an isolation plate 40 and a communicating pipe 41 are integrated with a carrier plate 10. A distribution cavity 21 is disposed on the isolation plate 40.

Specifically, the distribution cavity 21 includes the isolation plate 40 and a side wall 24 that surrounds the isolation plate 40. A jet plate 20 includes a jet wall 23. The jet wall 23 is provided on the side wall 24 and seals the distribution cavity 21.

The electronic device 500 may flexibly design a position of a liquid outlet pipe 15 by using an integrally designed carrier plate 10, and may further select different jet plates 20 based on different heater units 202.

Embodiment 5

Figure 16:
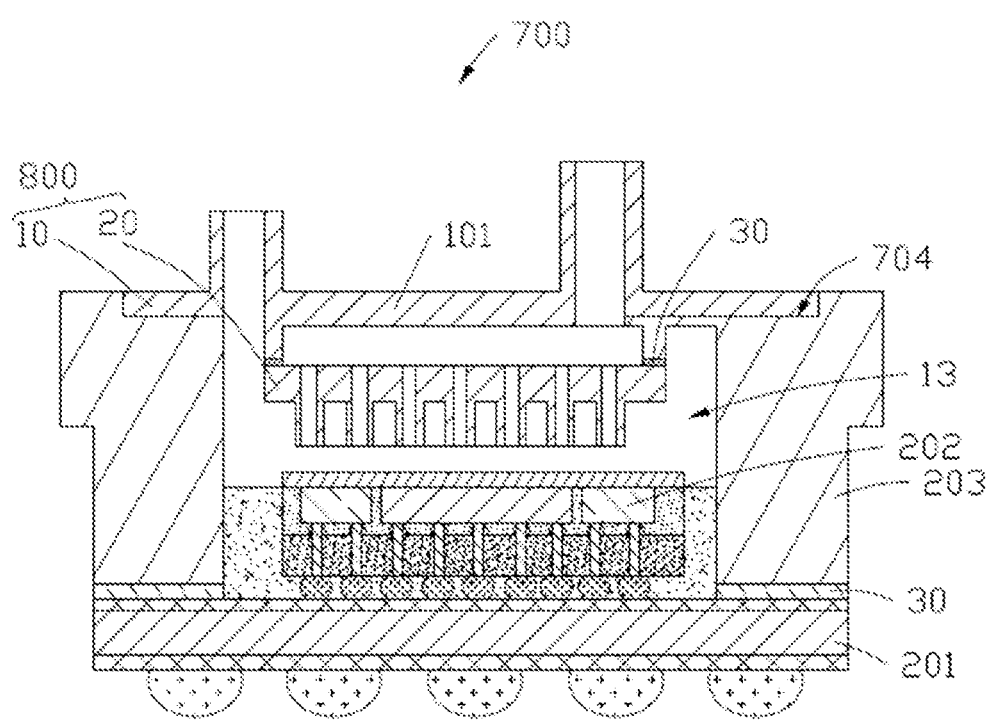
FIG. 16 is a schematic cross-sectional diagram of a structure of an electronic device according to a fifth embodiment of this disclosure.

FIG. 16 shows an electronic device 700 according to a fifth embodiment of this disclosure. The electronic device 700 includes a circuit board 201, a heater unit 202, a mounting bracket 203, and a cooling apparatus 800 disposed on the mounting bracket 203.

The electronic device 700 differs from the electronic device 200 in the second embodiment shown in FIG. 4 mainly in that a carrier plate 10 of the cooling apparatus 800 omits a peripheral wall 102. A top wall 101 is directly provided on the mounting bracket 203. The mounting bracket 203, the circuit board 201, and the top wall 101 enclose an accommodating groove 13.

Specifically, the mounting bracket 203 is relatively thick in a direction away from the circuit board 201, and a mounting surface 704 is provided on a side that is of the mounting bracket 203 and that is away from the circuit board 201. The top wall 101 is provided on the mounting surface 704. In an embodiment, the mounting surface 704 is a groove formed by recessing the mounting bracket 203 in a direction in which top of the mounting bracket 203 faces the circuit board.

In an embodiment, the carrier plate 10 may be fastened on the mounting bracket 203 by using a fastening member such as a screw. A sealing member such as a sealing adhesive and a seal ring is further disposed between the mounting bracket 203 and the carrier plate 10 for sealing.

In an embodiment, a wall surface of the mounting bracket 203 is also relatively thick, thereby allowing the carrier plate 10 to be fastened by using the screw or the like, and be sealed by using the seal ring or the like.

In the electronic device 700, by changing a structure of the mounting bracket 203, the mounting bracket 203 is provided higher, thereby simplifying design of the carrier plate 10. The carrier plate 10 may be conveniently provided on the top of the mounting bracket 203 by using the fastening member such as the screw. In addition, the carrier plate 10 is not provided with the peripheral wall 102, and the jet plate 20 may protrude from the carrier plate 10, thereby facilitating subsequent installation and replacement.

Embodiment 6

Figure 17:
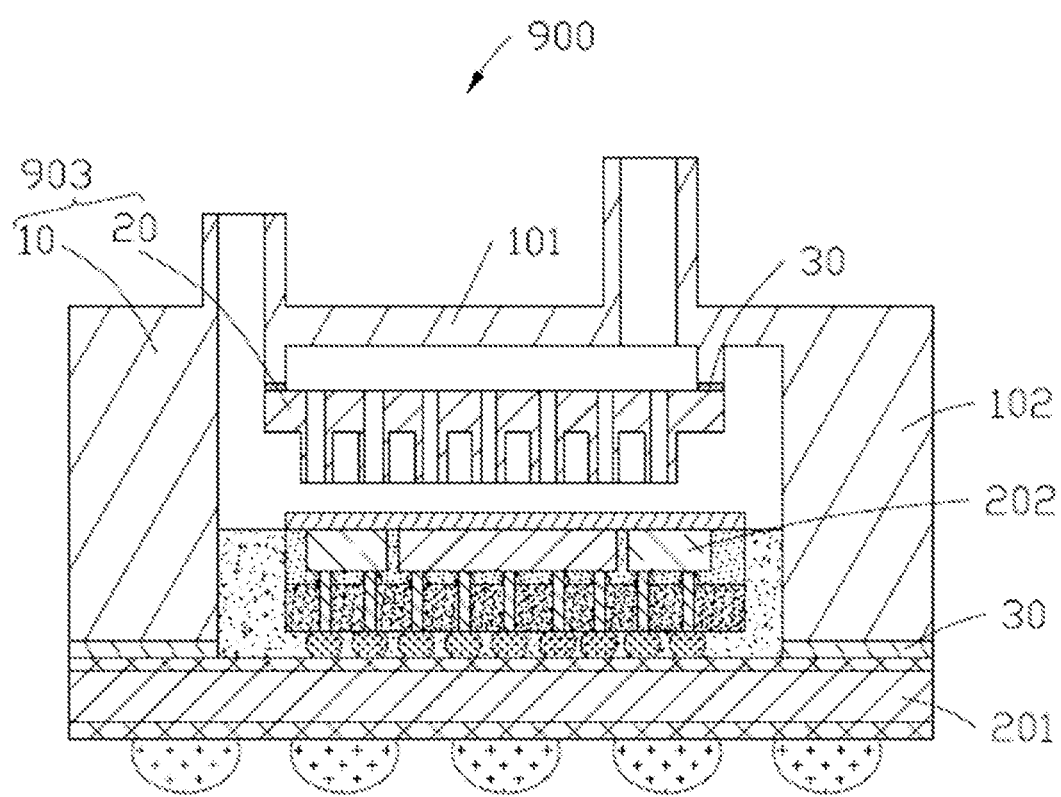
FIG. 17 is a schematic cross-sectional diagram of a structure of an electronic device according to a sixth embodiment of this disclosure.

FIG. 17 shows an electronic device 900 according to a sixth embodiment of this disclosure. The electronic device 900 includes a circuit board 201, a heater unit 202, and a cooling apparatus 903 disposed on the circuit board 201.

The electronic device 900 differs from an electronic device 200 in the second embodiment shown in FIG. 4 mainly in that there is no mounting bracket on the electronic device 900, and a carrier plate 10 of the cooling apparatus 903 is directly provided on the circuit board 201.

Specifically, a peripheral wall 102 of the carrier plate 10 of the cooling apparatus 903 extends for a long distance in a direction away from a top wall 101, and a side of the peripheral wall 102 that is away from the top wall 101 is provided on the circuit board 201.

The peripheral wall 102 of the carrier plate 10 is also thicker than the peripheral wall 102 of the carrier plate 10 in the Embodiment 3, so as to provide enough strength to implement a function of the mounting bracket.

In an embodiment, a sealing member 30 such as a sealing adhesive and a seal ring is further disposed between the circuit board 201 and the peripheral wall 102 of the carrier plate 10 for sealing.

The cooling apparatus 903 has a simple structure, and is easy to process and convenient to install. The electronic device 900 does not need the mounting bracket, and may be directly disposed on the circuit board 201 by using the carrier plate 10 of the cooling apparatus 903, which can reduce the processing costs and improve heat dissipation efficiency.

It may be understood that a distribution cavity 21 may be disposed on the carrier plate sp10, a jet plate 20, or an isolation plate 40 according to a requirement. Alternatively, the distribution cavity 21 may be formed by using the carrier plate 10 and the jet plate 20, or may be formed by using the isolation plate 40 and the jet plate 20.

It may be understood that the jet plate 20 in the cooling apparatus of this disclosure may further perform cooling on a plurality of heater units, provided that a plurality of heater units are sealed in a same collection cavity at the same time, and a nozzle 22 on the jet plate 20 corresponds to a corresponding heater unit.

The foregoing description is merely specific implementations of this disclosure, but is not intended to limit the protection scope of this disclosure. Any variation or replacement within the technical scope disclosed in this disclosure shall fall within the disclosed scope of this disclosure.

What is claimed is:

1. A cooling apparatus comprising:
a jet plate, and
a carrier plate provided with an accommodating groove, a coolant inlet, and a coolant outlet; wherein:
the jet plate is provided in the accommodating groove;
a plurality of nozzles are provided on the jet plate;
a distribution cavity is provided between the jet plate and the carrier plate, and the distribution cavity is configured to communicate with the coolant inlet;
the coolant inlet is configured to inject cooling liquid;
a collection cavity for backflow of the cooling liquid is formed in the accommodating groove, and the collection cavity is separated from the distribution cavity;
the coolant outlet is configured to communicate with the collection cavity and is configured for the cooling liquid to flow out of the collection cavity;
the cooling liquid is configured to be distributed to the jet plate through the distribution cavity, and sprayed to the collection cavity through at least one of the nozzles for heat exchange, and the cooling liquid obtained through the heat exchange is configured to be converged in the collection cavity and to flow out through the coolant outlet, and
at least two of the nozzles provided on the jet plate are different sizes, and the at two of the nozzles have different quantities of nozzle holes.

2. The cooling apparatus according to claim 1, wherein the carrier plate comprises a top wall and a peripheral wall, the peripheral wall surrounds the top wall to form the accommodating groove, and the coolant inlet and the coolant outlet are both provided on the top wall.

3. The cooling apparatus according to claim 2, wherein the distribution cavity is formed at least by the jet plate and a side wall that surrounds the jet plate, one end of the side wall is in contact with the jet plate, the other end of the side wall is in contact with the top wall, and the coolant inlet penetrates through a region that is of the top wall and that is surrounded by the side wall.

4. The cooling apparatus according to claim 1, wherein a size of a port of at least one of the nozzles located in the distribution cavity is greater than a size of a port located in the collection cavity.

5. The cooling apparatus according to claim 1, wherein there is a gap between two adjacent nozzles, and the gap forms a backflow channel for backflow of the sprayed cooling liquid.

6. The cooling apparatus according to claim 5, wherein the gap is provided on the jet plate and has a strip shape or a wave shape.

7. The cooling apparatus according to claim 1, wherein the distribution cavity is provided with a flow distribution plate to perform flow distribution on the cooling liquid entering the distribution cavity.

8. The cooling apparatus according to claim 2, wherein the cooling apparatus further comprises a communicating pipe and an isolation plate, one end of the communicating pipe is configured to communicate with the coolant inlet, the other end of the communicating pipe is configured to communicate with a through hole provided on the isolation plate, the distribution cavity is formed at least by the isolation plate, the jet plate, and the side wall that surrounds the jet plate, and the isolation plate, the top wall, and the peripheral wall enclose the collection cavity.

9. An electronic device comprising:
a circuit board;
a heater unit provided on the circuit board; and
a cooling apparatus comprising:
   a jet plate, and
   a carrier plate provided with an accommodating groove, a coolant inlet, and a coolant outlet; wherein:
   the jet plate is provided in the accommodating groove;
   a plurality of nozzles are provided on the jet plate;
   a distribution cavity is provided between the jet plate and the carrier plate, and the distribution cavity is configured to communicate with the coolant inlet;
   the coolant inlet is configured to inject cooling liquid;
   a collection cavity for backflow of the cooling liquid is formed in the accommodating groove, and the collection cavity is separated from the distribution cavity;
   the coolant outlet is configured to communicate with the collection cavity and is configured for the cooling liquid to flow out of the collection cavity; and
   the cooling liquid is configured to be distributed to the jet plate through the distribution cavity, and sprayed to the collection cavity through at least one of the nozzles for heat exchange, and the cooling liquid obtained through the heat exchange is configured to be converged in the collection cavity and to flow out through the coolant outlet; and
wherein the carrier plate is provided on the circuit board, the heater unit is provided in the collection cavity, and the jet plate is provided on a surface of the carrier plate facing the heater unit; and
wherein at least two of the nozzles provided on the jet plate are different sizes, and the at two of the nozzles have different quantities of nozzle holes.

10. The electronic device according to claim 9, wherein the carrier plate comprises a top wall and a peripheral wall, the peripheral wall surrounds the top wall to form the accommodating groove, and the coolant inlet and the coolant outlet are both provided on the top wall.

11. The electronic device according to claim 10, wherein the distribution cavity is formed at least by the jet plate and a side wall that surrounds the jet plate, one end of the side wall is in contact with the jet plate, the other end of the side wall is in contact with the top wall, and the coolant inlet penetrates through a region that is of the top wall and that is surrounded by the side wall.

12. The electronic device according to claim 9, wherein a size of a port of at least one of the nozzles located in the distribution cavity is greater than a size of a port located in the collection cavity.

13. The electronic device according to claim 9, wherein there is a gap between two adjacent nozzles, and the gap forms a backflow channel for backflow of the sprayed cooling liquid.

14. The electronic device according to claim 13, wherein the gap is provided on the jet plate and has a strip shape or a wave shape.

15. The electronic device according to claim 9, wherein the distribution cavity is provided with a flow distribution plate to perform flow distribution on the cooling liquid entering the distribution cavity.

16. The electronic device according to claim 10, wherein the cooling apparatus further comprises a communicating pipe and an isolation plate, one end of the communicating pipe is configured to communicate with the coolant inlet, the other end of the communicating pipe is configured to communicate with a through hole provided on the isolation plate, the distribution cavity is formed at least by the isolation plate, the jet plate, and the side wall that surrounds the jet plate, and the isolation plate, the top wall, and the peripheral wall enclose the collection cavity.

17. The electronic device according to claim 9, wherein there is a gap between the nozzle and the heater unit, to form a jet chamber in the collection cavity.

18. The electronic device according to claim 9, wherein a sputtering layer is provided on the heater unit.

19. A cooling apparatus comprising:
a jet plate, and
a carrier plate provided with an accommodating groove, a coolant inlet, and a coolant outlet; wherein:
the jet plate is provided in the accommodating groove;
a plurality of nozzles are provided on the jet plate;
a distribution cavity is provided between the jet plate and the carrier plate, and the distribution cavity is configured to communicate with the coolant inlet;
the coolant inlet is configured to inject cooling liquid;
a collection cavity for backflow of the cooling liquid is formed in the accommodating groove, and the collection cavity is separated from the distribution cavity;
the coolant outlet is configured to communicate with the collection cavity and is configured for the cooling liquid to flow out of the collection cavity;
the cooling liquid is configured to be distributed to the jet plate through the distribution cavity, and sprayed to the collection cavity through at least one of the nozzles for heat exchange, and the cooling liquid obtained through the heat exchange is configured to be converged in the collection cavity and to flow out through the coolant outlet; and
a size of a port of at least one of the nozzles located in the distribution cavity is greater than a size of a port located in the collection cavity.

20. The cooling apparatus according to claim 1, wherein:
a spacing between the nozzle holes on one of the nozzles is different from a spacing between the nozzle holes on another one of the nozzles.

* * * * *